United States Patent
Nishio et al.

(10) Patent No.: US 12,063,738 B2
(45) Date of Patent: Aug. 13, 2024

(54) MULTILAYER SUBSTRATE AND METHOD FOR MANUFACTURING SAME

(71) Applicant: Murata Manufacturing Co., Ltd., Nagaokakyo (JP)

(72) Inventors: Kosuke Nishio, Nagaokakyo (JP); Kazuya Soda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 205 days.

(21) Appl. No.: 17/897,747

(22) Filed: Aug. 29, 2022

(65) Prior Publication Data

US 2022/0418102 A1 Dec. 29, 2022

Related U.S. Application Data

(63) Continuation of application No. PCT/JP2021/014329, filed on Apr. 2, 2021.

(30) Foreign Application Priority Data

Apr. 7, 2020 (JP) ................. 2020-069181

(51) Int. Cl.
*H05K 1/02* (2006.01)
*H05K 1/11* (2006.01)
(Continued)

(52) U.S. Cl.
CPC ............. *H05K 1/0298* (2013.01); *H05K 1/11* (2013.01); *H05K 3/40* (2013.01); *H05K 3/4644* (2013.01)

(58) Field of Classification Search
CPC .......... H05K 1/0298; H05K 1/11; H05K 3/40; H05K 3/4644
See application file for complete search history.

(56) References Cited

U.S. PATENT DOCUMENTS 6,432,239 B1 * 8/2002 Mandai ............... H05K 3/4629
156/89.12
2007/0158101 A1 * 7/2007 Chikagawa ............ H05K 1/186
361/761
(Continued)

FOREIGN PATENT DOCUMENTS

JP 2004039732 A 2/2004
JP 2005072328 A 3/2005
(Continued)

OTHER PUBLICATIONS

International Search Report in PCT/JP2021/014329, mailed Jun. 29, 2021, 3 pages.
(Continued)

*Primary Examiner* — Sherman Ng
(74) *Attorney, Agent, or Firm* — Keating & Bennett, LLP

(57) ABSTRACT

A multilayer substrate includes a multilayer body in which insulating layers are laminated in a laminating direction, a front electrode that is provided on a front surface side of a first insulating layer which is positioned on a front surface side of the multilayer body among the insulating layers, a first internal electrode that is provided on an opposite side to the front electrode with the first insulating layer interposed therebetween, and a first interlayer connection conductor that electrically connects the front electrode and the first internal electrode with each other. The first interlayer connection conductor includes a front side connection surface that is electrically connected with the front electrode and a back side connection surface that is electrically connected with the first internal electrode.

18 Claims, 8 Drawing Sheets

(51) Int. Cl.
    *H05K 3/40*     (2006.01)
    *H05K 3/46*     (2006.01)

(56) References Cited

U.S. PATENT DOCUMENTS

| | | | |
|---|---|---|---|
| 2007/0184251 A1* | 8/2007 | Chikagawa | B32B 18/00 156/89.18 |
| 2010/0224396 A1* | 9/2010 | Nomiya | B32B 3/08 156/89.12 |
| 2014/0036467 A1* | 2/2014 | Otsubo | H05K 3/00 156/89.12 |
| 2018/0054891 A1 | 2/2018 | Ishihara et al. | |

FOREIGN PATENT DOCUMENTS

| | | | |
|---|---|---|---|
| JP | 2010087429 A | 4/2010 | |
| JP | 4957638 B2 | 6/2012 | |
| JP | 2018014387 A | 1/2018 | |
| JP | 2018032659 A | 3/2018 | |
| WO | 2012124362 A1 | 9/2012 | |

OTHER PUBLICATIONS

Written Opinion in PCT/JP2021/014329, mailed Jun. 29, 2021, 5 pages.

\* cited by examiner

MULTILAYER SUBSTRATE AND METHOD FOR MANUFACTURING SAME

CROSS REFERENCE TO RELATED APPLICATIONS

This application claims the benefit of priority to Japanese Patent Application No. 2020-069181, filed on Apr. 7, 2020, and is a Continuation Application of PCT Application No. PCT/JP2021/014329, filed on Apr. 2, 2021. The entire contents of each application are hereby incorporated herein by reference.

BACKGROUND OF THE INVENTION

1. Field of the Invention

The present invention relates to a multilayer substrate and a method for manufacturing the multilayer substrate.

2. Description of the Related Art

Japanese Unexamined Patent Application Publication No. 2018-32659 discloses a printed wiring board that is provided with first conductor pads and second conductor pads which are respectively formed on a first surface and a second surface of a multilayer body, in which conductors and resin insulators are laminated, and in which a pitch of the second conductor pads is larger than a pitch of the first conductor pads. Via conductors that decrease in diameter from the first surface side toward the second surface side are formed to penetrate through the resin insulators.

Japanese Unexamined Patent Application Publication No. 2005-72328 discloses a multilayer wiring board that includes an insulating substrate in which a plurality of insulating layers are laminated, wiring circuit layers formed on a surface and in an inside of the insulating substrate, and an interlayer connection conductor penetrating through the insulating layer that is vertically interposed between the wiring circuit layers. The sizes of a plurality of interlayer connection conductors gradually decrease from a terminal pad side to an electric device connecting pad side.

Japanese Unexamined Patent Application Publication No. 2018-32659 provides illustrations and descriptions on sectional lengths of an internal electrode arranged on the first surface side (inner side) of the via conductor (hereinafter, referred to as an interlayer connection conductor) and the second conductor pads (hereinafter, referred to as front electrodes) arranged on the second surface side (front side). However, Japanese Unexamined Patent Application Publication No. 2018-32659 does not provide any description on a paper surface orthogonal direction and therefore, overall shapes of the front electrode and internal electrode are not clear.

In Japanese Unexamined Patent Application Publication No. 2005-72328, the wiring circuit layer (hereinafter, referred to as a front electrode) positioned on the front side of the insulating substrate is arranged on the larger diameter side of the via conductor (hereinafter, referred to as an interlayer connection conductor) and the wiring circuit layer (hereinafter, referred to as an internal electrode) positioned in the inner side of the insulating substrate is arranged on the smaller diameter side of the interlayer connection conductor. However, since the interlayer connection conductor is configured to gradually increase in diameter from the inner side to the front side, size reduction of the front electrode is difficult.

In a multilayer substrate including a multilayer body in which a plurality of insulating layers are laminated in a laminating direction, a front electrode positioned on the front side of the multilayer body and an internal electrode positioned in the inner side of the multilayer body are electrically connected with each other with an interlayer connection conductor interposed therebetween. The front electrode is on a position overlapping with the internal electrode when viewed in the laminating direction of the multilayer body and therefore, electrostatic capacitance is generated between the front electrode and the internal electrode. If multilayer substrates are more reduced in size and thickness, an interval between a front electrode and an internal electrode becomes shorter, generating larger electrostatic capacitance.

In a multilayer substrate used in a high frequency band such as a megahertz band and a gigahertz band, high frequency characteristics deteriorate due to generation of unwanted electrostatic capacitance.

SUMMARY OF THE INVENTION

Preferred embodiments of the present invention provide multilayer substrates that each reduce or prevent generation of unwanted electrostatic capacitance and methods for manufacturing such multilayer substrates.

A multilayer substrate according to a preferred embodiment of the present invention includes a multilayer body including a plurality of insulating layers laminated in a laminating direction, a front electrode on a front side of a first insulating layer which is positioned on a front side of the multilayer body among the insulating layers, a first internal electrode on a back side of the first insulating layer, and a first interlayer connection conductor penetrating through the first insulating layer in the laminating direction and electrically connecting the front electrode and the first internal electrode with each other. The first interlayer connection conductor includes a front side connection surface, which is electrically connected with the front electrode, and a back side connection surface, which is electrically connected with the first internal electrode. An outer shape of the front side connection surface of the first interlayer connection conductor is within an outer shape of the back side connection surface of the first interlayer connection conductor. The front electrode has a shape covering the front side connection surface of the first interlayer connection conductor and the first internal electrode has a shape covering the back side connection surface of the first interlayer connection conductor. The front electrode is smaller than the first internal electrode and is within an outer edge of the first internal electrode when viewed in the laminating direction.

According to preferred embodiments of the present invention, a region of the front electrode covering the front side connection surface of the first interlayer connection conductor is smaller than a region of the first internal electrode covering the back side connection surface of the first interlayer connection conductor and accordingly, electrostatic capacitance generated between the front electrode and the first internal electrode can be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a sectional view of the resin multilayer substrate, and FIG. 1B is a plan view of a conductive layer.

FIG. 2A illustrates a configuration in which the signal line is narrower than the internal electrode, and FIG. 2B illustrates a configuration in which the signal line is wider than the internal electrode.

DETAILED DESCRIPTION OF THE PREFERRED EMBODIMENTS

Figure 1A:
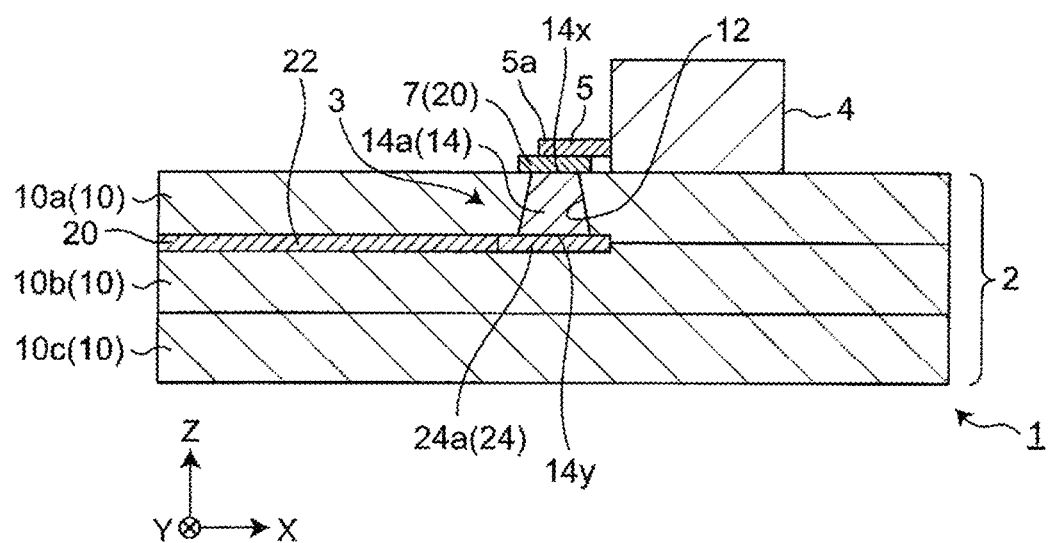
FIGS. 1A and 1B are drawings schematically illustrating a resin multilayer substrate according to a first preferred embodiment of the present invention.

Preferred embodiments of a resin multilayer substrate 1 according to the present invention will be described below with reference to the accompanying drawings. Each drawing shows an X axis, a Y axis, and a Z axis that are orthogonal to each other, for convenience and clarity. An X-axis direction is a direction in which a terminal 5 of an electronic component 4 mounted on the resin multilayer substrate 1 is extended. A Y-axis direction is a direction orthogonal to the X axis. A Z-axis direction is a laminating direction of a multilayer body 2 in the resin multilayer substrate 1. Further, in the present disclosure, a "front side" is a side on which a front electrode 7 is provided in the multilayer body 2, and a "back side" is a side that is an opposite side to the side on which the front electrode 7 is provided in the multilayer body 2, that is, the "back side" is the side on which a back electrode 9 is provided in the multilayer body 2.

First Preferred Embodiment

Figure 1B:
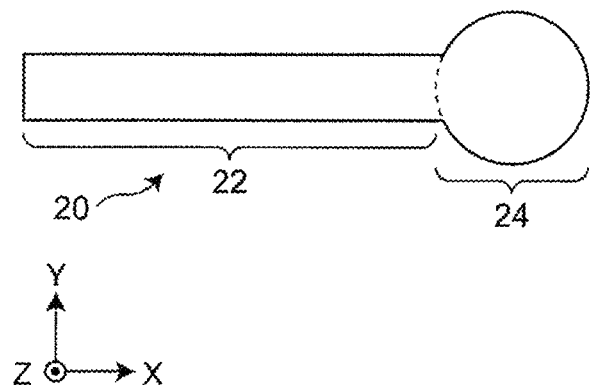
Figure 2A:
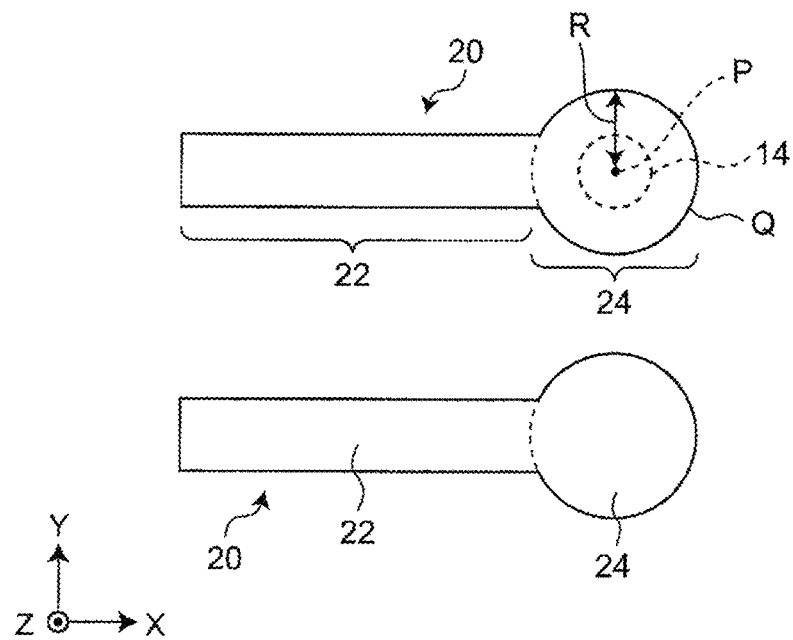
FIGS. 2A and 2B are drawings explaining a relationship between a signal line and an internal electrode in the conductive layer.
Figure 2B:
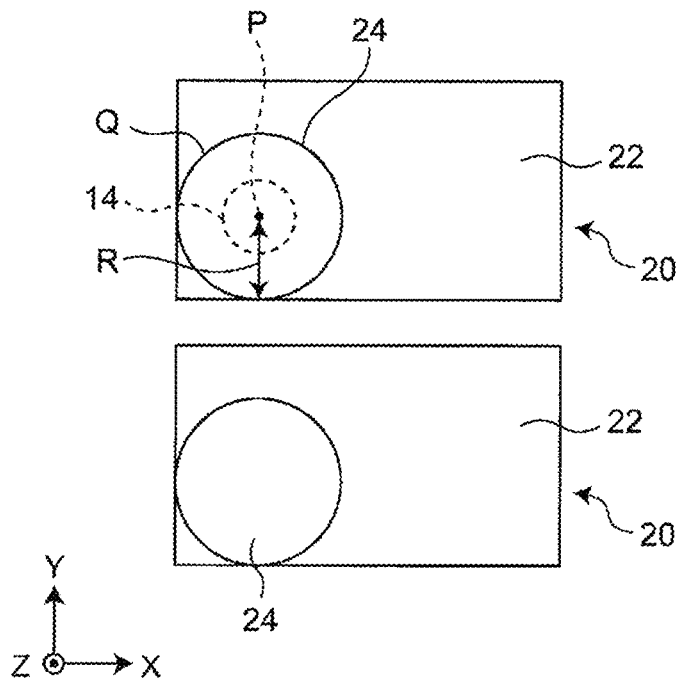
Figure 3:
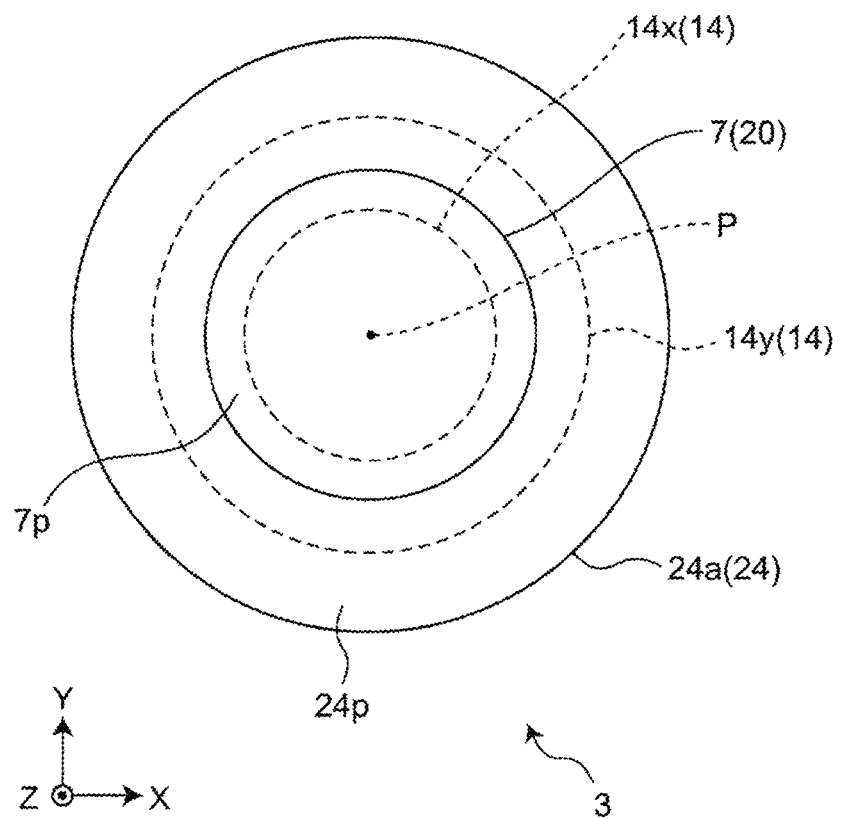
FIG. 3 is a drawing explaining an electrode structure in the resin multilayer substrate.

The resin multilayer substrate 1 according to a first preferred embodiment of the present invention will be described with reference to FIGS. 1 to 3. FIGS. 1A and 1B are drawings schematically illustrating the resin multilayer substrate 1 according to the first preferred embodiment. FIG. 1A is a sectional view of the resin multilayer substrate 1, and FIG. 1B is a plan view of a conductive layer 20. FIGS. 2A and 2B are drawings explaining a relation between a signal line 22 and an internal electrode 24 in the conductive layer 20. FIG. 2A illustrates a configuration in which the signal line 22 is narrower than the internal electrode 24, and FIG. 2B illustrates a configuration in which the signal line 22 is wider than the internal electrode 24. FIG. 3 is a drawing explaining an electrode structure 3 in the resin multilayer substrate 1.

As illustrated in FIG. 1A, the resin multilayer substrate 1 acts as a multilayer substrate, in which a plurality of insulating layers 10 and the conductive layer 20 are laminated, and preferably includes, for example, the multilayer body 2 in which a plurality of resin layers 10 are laminated in a laminating direction Z. On the front side of the multilayer body 2, a first resin layer 10a among the plurality of resin layers 10 is arranged. The first resin layer 10a acts as a first insulating layer having an electrical insulation property. On the inner side of the first resin layer 10a, a second resin layer 10b is arranged in a manner to be adjacent to the first resin layer 10a. The second resin layer 10b acts as a second insulating layer having the electrical insulation property. A third resin layer 10c is arranged in a manner to be adjacent to the second resin layer 10b. The third resin layer 10c acts as a third insulating layer having the electrical insulation property. Thus, in the multilayer body 2 illustrated in FIG. 1, three resin layers 10, namely, the first resin layer 10a, the second resin layer 10b, and the third resin layer 10c are laminated in the laminating direction Z.

The resin layer 10 acts as an insulating layer having the electrical insulation property and is preferably mainly made of thermoplastic resin, for example. Examples of thermoplastic resin include liquid crystal polymer resin (LCP resin), polyetheretherketone resin (PEEK resin), polyetherimide resin (PEI resin), polyphenylene sulfide resin (PPS resin), and thermoplastic polyimide resin (PI resin). Preferably, the resin layer 10 is LCP resin, for example. Accordingly, a resin multilayer substrate having excellent high frequency characteristics can be obtained.

The multilayer body 2 includes the conductive layer 20 that is arbitrarily arranged on the surface or the inside of the multilayer body 2. The conductive layer 20 extends in a surface direction that is orthogonal to the laminating direction Z of the multilayer body 2. The conductive layer 20 is preferably provided as a conductive wiring pattern and is a metal foil such as, for example, a copper foil. On the front surface of the multilayer body 2, that is, on the front surface of the first resin layer 10a, the front electrode 7 is provided as the conductive layer 20. The terminal 5 of the electronic component 4 is bonded to the front electrode 7 with a conductive bonding material, not illustrated, (such as solder, for example) interposed therebetween and is electrically connected with the front electrode 7. Thus, the front electrode 7 acts as a mounting electrode to mount the electronic component 4. The front electrode 7 preferably includes, for example, a circular or substantially circular shape when viewed in the laminating direction Z. The electronic component 4 is preferably, for example, a connector including a plurality of terminals 5.

An end portion 5a of the terminal 5 of the electronic component 4 is within an outer edge of the front electrode 7 when viewed in the laminating direction Z. In other words, the end portion 5a of the terminal 5 is configured so as not to protrude from the front electrode 7 when viewed in the laminating direction Z. This configuration can reduce or prevent electrostatic capacitance generated between the terminal 5 of the electronic component 4 and a first internal electrode 24a.

As illustrated in FIG. 1B, the conductive layer 20 extending in the surface direction which is orthogonal or substantially orthogonal to the laminating direction Z is provided in the inside of the multilayer body 2, that is, between the first resin layer 10a and the second resin layer 10b. The conductive layer 20 preferably includes the first internal electrode 24a defining and functioning as the internal electrode 24 and the signal line 22 communicating with the first internal electrode 24a. Viewed in the laminating direction Z, the first internal electrode 24a preferably has, for example, a circular or substantially circular shape and the signal line 22 preferably has, for example, a rectangular or substantially rectangular shape. The first internal electrode 24a and the signal line 22 extend in the surface direction which is orthogonal or substantially orthogonal to the laminating direction Z. The signal line 22 extends so as not to overlap with the terminal 5 of the electronic component 4 when viewed in the laminating direction Z. This configuration can reduce or prevent electrostatic capacitance generated between the terminal 5 of the electronic component 4 and the signal line 22.

As illustrated in FIGS. 2A and 2B, the internal electrode 24 can be defined as a region that is encircled by a virtual circle Q whose radius is a line segment R. The line segment R extends radially from a conductor center P of the interlayer connection conductor 14 (shown by a dashed circle) and connects to the signal line 22 at the shortest distance. FIG. 2A illustrates a configuration in which the signal line 22 is configured to be narrower than the internal electrode 24 and the virtual circle Q intersects with the signal line 22. A boundary between the region of the signal line 22 and the region of the internal electrode 24 is shown by a dashed line. FIG. 2B illustrates a configuration in which the signal line 22 is wider than the internal electrode 24 and the virtual circle Q is in contact with the signal line 22.

As illustrated in FIG. 1A, a first interlayer connection conductor 14a extends in the laminating direction Z to penetrate through the first resin layer 10a. The first interlayer connection conductor 14a acts as the interlayer connection conductor 14, is also called a via conductor, and electrically connects the front electrode 7 and the first internal electrode 24a with each other. The first interlayer connection conductor 14a is preferably formed through solidification of resin of a conductive paste that is filled in an interlayer connection hole 12 formed in the first resin layer 10a. Here, the conductive paste is a paste including low melting point metal, such as tin, and resin, for example.

While the front electrode 7 and the internal electrode 24 such as the first internal electrode 24a are preferably, for example, metal foils serving as the conductive layer 20, the interlayer connection conductor 14 such as the first interlayer connection conductor 14a is, for example, low melting point metal and resin. Accordingly, the front electrode 7 and the internal electrode 24 can be distinguished from the interlayer connection conductor 14 by observing those cross-sectional structures with a microscope (for example, an electron microscope). Also when the interlayer connection conductor 14 is formed by plating, the front electrode 7 and the internal electrode 24 can be distinguished from the interlayer connection conductor 14 in the same or similar manner.

The first interlayer connection conductor 14a preferably has, for example, a tapered shape that decreases in diameter from the inner side (back side) of the first resin layer 10a toward the front side in the laminating direction Z. The first interlayer connection conductor 14a preferably includes a front side connection surface 14x and a back side connection surface 14y. The front side connection surface 14x is positioned on the front side and is electrically connected with the front electrode 7. The back side connection surface 14y is positioned on an opposite side to the front side connection surface 14x (the back side) and is electrically connected with the first internal electrode 24a. Each of the front side connection surface 14x and the back side connection surface 14y preferably has, for example, a circular or substantially circular shape when viewed in the laminating direction Z. An outer shape of the front side connection surface 14x of the first interlayer connection conductor 14a is within an outer shape of the back side connection surface 14y of the first interlayer connection conductor 14a. The length in the X-axis direction and the length in the Y-axis direction of the front side connection surface 14x are shorter than respective lengths of the back side connection surface 14y. In other words, the first interlayer connection conductor 14a has a trapezoidal shape in cross-sectional view, in which the front side connection surface 14x corresponds to a short side of the trapezoid and the back side connection surface 14y corresponds to a long side of the trapezoid. More specifically, an area of the front side connection surface 14x of the first interlayer connection conductor 14a is smaller than an area of the back side connection surface 14y.

As described below, the multilayer body 2 of the resin multilayer substrate 1 preferably includes an electrode structure 3 in which the front electrode 7 is smaller than the first internal electrode 24a and is within the outer edge of the first internal electrode 24a when viewed in the laminating direction Z. The electrode structure 3 is a structure defined by the front electrode 7, the first internal electrode 24a, and the first interlayer connection conductor 14a, as illustrated in FIGS. 1 and 3. In the electrode structure 3, the front electrode 7, the first internal electrode 24a, the front side connection surface 14x, and the back side connection surface 14y are in a substantially concentric relation centered on the conductor center P of the first interlayer connection conductor 14a, as illustrated in FIG. 3. Here, the phrase "substantially concentric" in the present specification is intended to include an eccentric configuration with centers which are slightly off from each other as well as a concentric configuration with mutually-accorded centers.

When viewed in the laminating direction Z, the front electrode 7 has a shape covering the front side connection surface 14x such as the same or similar shape to that of the front side connection surface 14x, more specifically, a circular or substantially circular shape, for example, and has a smaller diameter than the first internal electrode 24a. The front electrode 7 preferably includes a decreased diameter overhang portion 7p that protrudes radially outward from the front side connection surface 14x. The front electrode 7 has a larger diameter than the front side connection surface 14x. The decreased diameter overhang portion 7p has, for example, an annular shape and acts as a first tolerance to position the front electrode 7 to the front side connection surface 14x when the front electrode 7 is provided on the first resin layer 10a. Here, the phrase "circular or substantially circular shape" in the present specification includes a circular shape such as an elliptical shape, an egg shape, and an oval shape, in addition to a perfect circle.

Viewed in the laminating direction Z, the first internal electrode 24a has a shape covering the back side connection surface 14y such as the same or similar shape to that of the back side connection surface 14y, more specifically, a circular or substantially circular shape, for example, and has a larger diameter than the front electrode 7. The first internal electrode 24a preferably includes an increased diameter overhang portion 24p that protrudes radially outward from the back side connection surface 14y. The first internal electrode 24a has a larger diameter than the back side connection surface 14y. The increased diameter overhang portion 24p has, for example, an annular shape and acts as a second tolerance to position the first internal electrode 24a to the back side connection surface 14y when the multilayer body 2 is preferably formed by laminating the plurality of resin layers 10.

The first tolerance is related to the accuracy of patterning in forming the front electrode 7, and therefore does not require a large tolerance. On the other hand, the second tolerance is related to lamination accuracy in laminating the resin layers 10, and therefore requires a large tolerance. Accordingly, a radial dimension of the first tolerance, namely, the decreased diameter overhang portion 7p can be set to be smaller than a radial dimension of the second tolerance, namely, the increased diameter overhang portion 24p. The front side connection surface 14x has the smaller diameter than the back side connection surface 14y and the decreased diameter overhang portion 7p has the smaller diameter than the increased diameter overhang portion 24p. Accordingly, the diameter of the front electrode 7 obtained by adding the front side connection surface 14x and the decreased diameter overhang portion 7p to each other can be set to be smaller than the diameter of the first internal electrode 24a obtained by adding the back side connection surface 14y and the increased diameter overhang portion 24p to each other. In other words, the region of the front electrode 7 that protrudes from the front side connection surface 14x of the first interlayer connection conductor 14a (that is, the radial width of the decreased diameter overhang portion 7p) can be set to be smaller than the region of the first internal electrode 24a that protrudes from the back side connection surface 14y of the first interlayer connection conductor 14a (that is, the radial width of the increased diameter overhang portion 24p).

Thus, the front electrode 7, the first internal electrode 24a, and the first interlayer connection conductor 14a constitute the electrode structure 3 in which the front electrode 7 is smaller than the first internal electrode 24a and is within the outer edge of the first internal electrode 24a when viewed in the laminating direction Z. According to this configuration, the region of the front electrode 7 covering the front side connection surface 14x of the first interlayer connection conductor 14a is smaller than the region of the first internal electrode 24a covering the back side connection surface 14y of the first interlayer connection conductor 14a and accordingly, electrostatic capacitance generated between the front electrode 7 and the first internal electrode 24a can be reduced or prevented. Further, this configuration can reduce electrostatic capacitance generated between a plurality of terminals 5 in the electronic component 4 mounted on the front electrode 7, thus being able to accommodate reduction in pitch and size of the electronic component 4.

Second Preferred Embodiment

Figure 4:
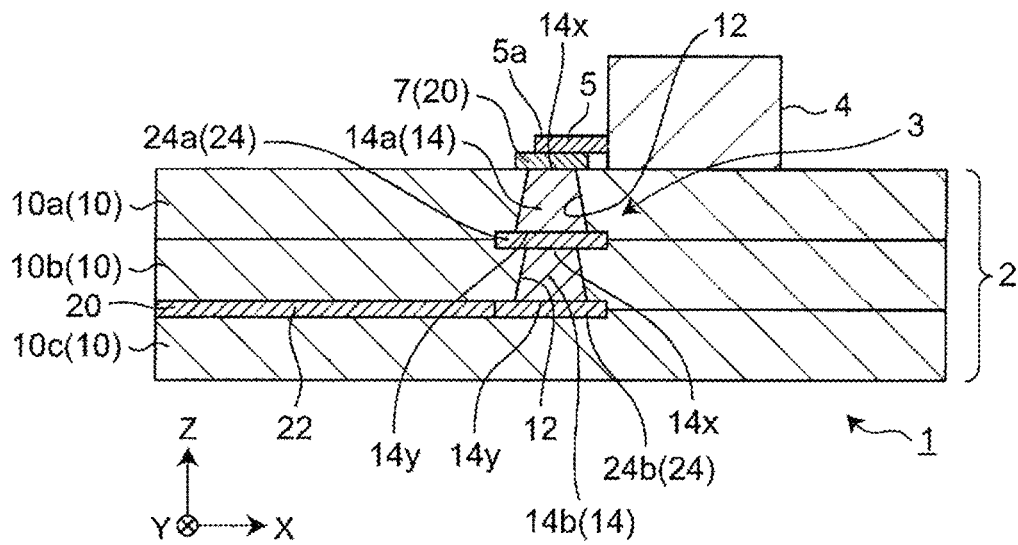
FIG. 4 is a sectional view schematically illustrating a resin multilayer substrate according to a second preferred embodiment of the present invention.

The resin multilayer substrate 1 according to a second preferred embodiment of the present invention will be described with reference to FIG. 4. FIG. 4 is a sectional view schematically illustrating the resin multilayer substrate 1 according to the second preferred embodiment. The second preferred embodiment is characterized in that the second resin layer 10b preferably includes a second interlayer connection conductor 14b having a tapered shape, a second internal electrode 24b is electrically connected to the back side connection surface 14y of the second interlayer connection conductor 14b having the tapered shape, and the front electrode 7 is within an outer edge of the second internal electrode 24b.

In FIG. 4, the resin multilayer substrate 1 includes the second internal electrode 24b and the second interlayer connection conductor 14b. The second internal electrode 24b is provided on the back side of the second resin layer 10b. The second interlayer connection conductor 14b penetrates through the second resin layer 10b in the laminating direction Z and electrically connects the first internal electrode 24a and the second internal electrode 24b with each other. The first interlayer connection conductor 14a of the first resin layer 10a and the second interlayer connection conductor 14b of the second resin layer 10b are arranged in series in the laminating direction Z and are positioned to be overlapped with each other in a substantially straight line when viewed in the laminating direction Z. Here, the phrase "a substantially straight line when viewed in the laminating direction Z" in the present specification is intended to include a configuration in which centers are slightly off from each other when viewed in the laminating direction Z as well as a configuration in which centers are on a straight line when viewed in the laminating direction Z.

The second interlayer connection conductor 14b acts as the interlayer connection conductor 14 and preferably has, for example, a tapered shape that decreases in diameter from the inner side (back side) of the second resin layer 10b toward the front side. The second interlayer connection conductor 14b includes the front side connection surface 14x and the back side connection surface 14y. The front side connection surface 14x is positioned on the front side and is electrically connected with the first internal electrode 24a. The back side connection surface 14y is positioned on the opposite side to the front side connection surface 14x (the back side) and is electrically connected with the second internal electrode 24b. Each of the front side connection surface 14x and the back side connection surface 14y of the second interlayer connection conductor 14b has, for example, a circular shape when viewed in the laminating direction Z. An outer shape of the front side connection surface 14x of the second interlayer connection conductor 14b is within an outer shape of the back side connection surface 14y of the second interlayer connection conductor 14b. The length in the X-axis direction and the length in the Y-axis direction of the front side connection surface 14x are shorter than respective lengths of the back side connection surface 14y. In other words, the second interlayer connection conductor 14b has a trapezoidal shape in cross-sectional view, in which the front side connection surface 14x corresponds to a short side of the trapezoid and the back side connection surface 14y corresponds to a long side of the trapezoid. More specifically, an area of the front side connection surface 14x of the second interlayer connection conductor 14b is smaller than an area of the back side connection surface 14y.

Viewed in the laminating direction Z, the first internal electrode 24a has, for example, the circular or substantially circular shape as described above and the second internal electrode 24b has a shape covering the back side connection surface 14y of the second interlayer connection conductor 14b such as the same or similar shape to that of the back side connection surface 14y of the second interlayer connection conductor 14b, more specifically, a circular or substantially circular shape, for example. The second internal electrode 24b has the same or substantially the same shape as that of the first internal electrode 24a and corresponds to the back side connection surface 14y of the second interlayer connection conductor 14b and accordingly, the region of the second internal electrode 24b is larger than the region of the front electrode 7. The first interlayer connection conductor 14a and the second interlayer connection conductor 14b are on positions overlapping with each other in a straight or substantially straight line when viewed in the laminating direction Z and the region of the front electrode 7 is smaller than that of the second internal electrode 24b and is within an outer edge of a region of the second internal electrode 24b when viewed in the laminating direction Z. Thus, the region of the front electrode 7 covering the front side connection surface 14x of the first interlayer connection conductor 14a is smaller than the region of the second internal electrode 24b covering the back side connection surface 14y of the second interlayer connection conductor 14b and consequently, electrostatic capacitance generated between the front electrode 7 and the second internal electrode 24b can be reduced or prevented.

Third Preferred Embodiment

Figure 5:
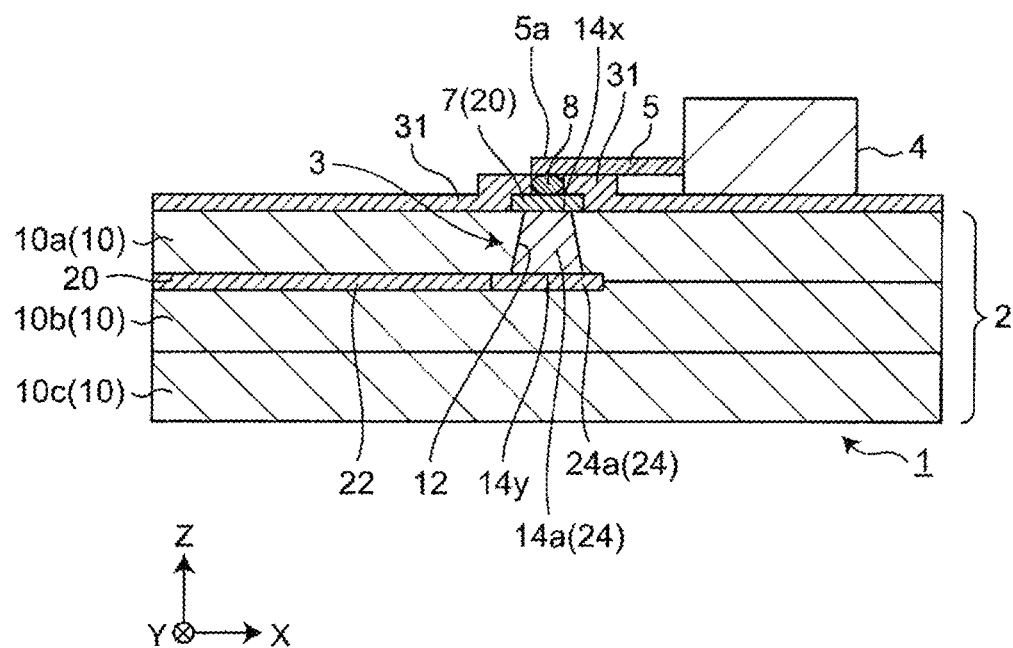
FIG. 5 is a sectional view schematically illustrating a resin multilayer substrate according to a third preferred embodiment of the present invention.
Figure 6:
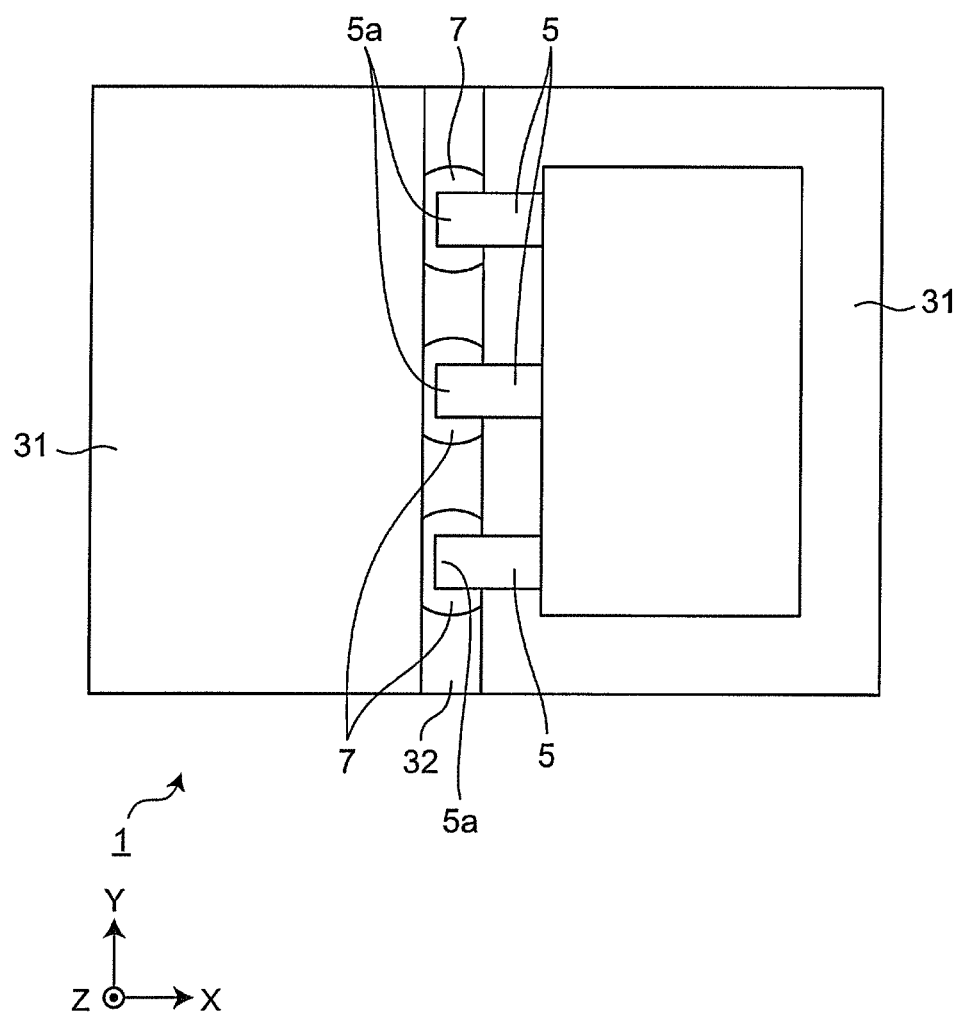
FIG. 6 is a plan view of the resin multilayer substrate illustrated in FIG. 5.

The resin multilayer substrate 1 according to a third preferred embodiment of the present invention will be described with reference to FIGS. 5 and 6. FIG. 5 is a sectional view schematically illustrating the resin multilayer substrate 1 according to the third preferred embodiment. FIG. 6 is a plan view of the resin multilayer substrate 1 illustrated in FIG. 5. The third preferred embodiment is characterized in that a protective layer 31 covering the front surface of the first resin layer 10a is provided.

In FIGS. 5 and 6, the protective layer 31 is provided on the front side of the first resin layer 10a. The protective layer 31 is preferably, for example, a coverlay film or solder resist film having an electrical insulation property. The protective layer 31 covers the front surface of the first resin layer 10a and preferably includes an opening 32 to expose a portion of the front electrode 7. The opening 32 extends in the Y-axis direction, which is an alignment direction of a plurality of front electrodes 7, and partially exposes the front electrodes 7. The terminals 5 of the electronic component 4 are bonded to respective front electrodes 7 exposed from the opening with a conductive bonding material 8, such as solder, interposed therebetween and the terminals 5 are electrically connected with the front electrodes 7.

When the front electrode 7 has, for example, a circular shape when viewed in the laminating direction Z, arc portions on one side and the other side of the front electrode 7 are covered by the protective layer 31 and the front electrode 7 is exposed in an oval shape, for example. Thus, the region of the front electrode 7 is reduced. This configuration can reduce or prevent electrostatic capacitance generated between the front electrode 7 and the terminal 5. Here, the front electrode 7 may have a rectangular or substantially rectangular shape.

The protective layer 31 is not provided between mutually-adjacent terminals 5 and 5. This configuration can reduce or prevent electrostatic capacitance generated between the mutually-adjacent terminals 5 and 5.

Fourth Preferred Embodiment

Figure 7:
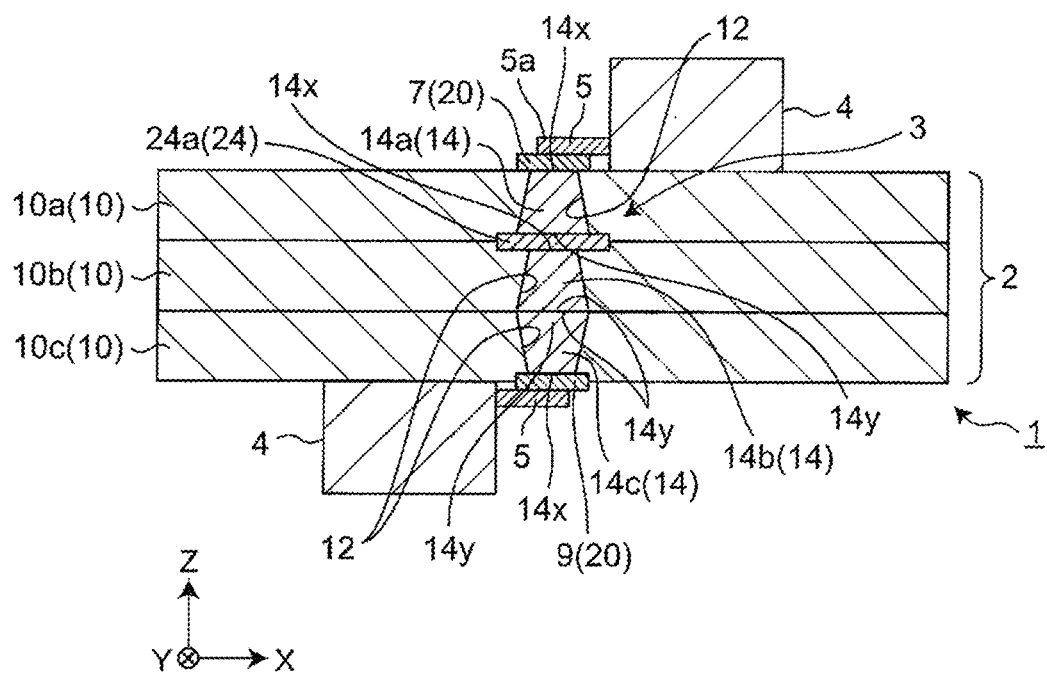
FIG. 7 is a sectional view schematically illustrating a resin multilayer substrate according to a fourth preferred embodiment of the present invention.

The resin multilayer substrate 1 according to a fourth preferred embodiment of the present invention will be described with reference to FIG. 7. FIG. 7 is a sectional view schematically illustrating the resin multilayer substrate 1 according to the fourth preferred embodiment. The fourth preferred embodiment is characterized in that the electrode structure 3, in which the front electrode 7 is smaller than the first internal electrode 24a and is within the outer edge of the first internal electrode 24a when viewed in the laminating direction Z, is provided on the front side of the multilayer body 2 and the back electrode 9 is within the outer edge of the first internal electrode 24a when viewed in the laminating direction Z.

In FIG. 7, the resin multilayer substrate 1 preferably includes the second interlayer connection conductor 14b and a third interlayer connection conductor 14c that acts as a back side interlayer connection conductor. The first interlayer connection conductor 14a, the second interlayer connection conductor 14b, and the third interlayer connection conductor 14c are arranged in series in the laminating direction Z and are on positions overlapping with each other in a straight or substantially straight line when viewed in the laminating direction Z.

The second interlayer connection conductor 14b penetrates through the second resin layer 10b acting as a certain resin layer (certain insulating layer) in the laminating direction Z and has, for example, a tapered shape that decreases in diameter from the inner side (back side) of the multilayer body 2 toward the front side. The second interlayer connection conductor 14b acts as a certain interlayer connection conductor and includes the front side connection surface 14x and the back side connection surface 14y. The front side connection surface 14x is positioned closer to the front side and is electrically connected with the first internal electrode 24a. The back side connection surface 14y is positioned on the opposite side to the front side connection surface 14x (the back side). Each of the front side connection surface 14x and the back side connection surface 14y of the second interlayer connection conductor 14b has, for example, a circular shape when viewed in the laminating direction Z. The outer shape of the front side connection surface 14x of the second interlayer connection conductor 14b is within the outer shape of the back side connection surface 14y of the second interlayer connection conductor 14b. The length in the X-axis direction and the length in the Y-axis direction of the front side connection surface 14x are shorter than those of the back side connection surface 14y. In other words, the second interlayer connection conductor 14b has a trapezoidal shape in cross-sectional view, in which the front side connection surface 14x corresponds to a short side of the trapezoid and the back side connection surface 14y corresponds to a long side of the trapezoid. More specifically, the area of the front side connection surface 14x of the second interlayer connection conductor 14b is smaller than the area of the back side connection surface 14y.

The third interlayer connection conductor 14c penetrates through the third resin layer 10c acting as another resin layer (another insulating layer) and as a back side resin layer (back side insulating layer) in the laminating direction Z and has a tapered shape that decreases in diameter from the inner side (back side) of the multilayer body 2 toward the back surface side. The third interlayer connection conductor 14c acts as another interlayer connection conductor and as a back side interlayer connection conductor and includes the front side connection surface 14x and the back side connection surface 14y. The front side connection surface 14x is positioned on the back surface side and is electrically connected with the back electrode 9. The back side connection surface 14y is positioned on the opposite side to the front side connection surface 14x (the front side). Each of the front side connection surface 14x and the back side connection surface 14y of the third interlayer connection conductor 14c has, for example, a circular shape when viewed in the laminating direction Z. An outer shape of the front side connection surface 14x of the third interlayer connection conductor 14c is within an outer shape of the back side connection surface 14y of the third interlayer connection conductor 14c. The length in the X-axis direction and the length in the Y-axis direction of the front side connection surface 14x are shorter than those of the back side connection surface 14y. In other words, the third interlayer connection conductor 14c has an inverted trapezoidal shape in cross-sectional view, in which the front side connection surface 14x corresponds to a short side of the trapezoid and the back side connection surface 14y corresponds to a long side of the trapezoid. More specifically, the area of the front side connection surface 14x of the third interlayer connection conductor 14c is smaller than the area of the back side connection surface 14y.

The second interlayer connection conductor 14b acting as the certain interlayer connection conductor and the third interlayer connection conductor 14c acting as the other interlayer connection conductor and as the back side interlayer connection conductor define a connection structure in which the second interlayer connection conductor 14b and the third interlayer connection conductor 14c are bonded in series in the laminating direction Z. The back side connection surface 14y of the second interlayer connection conductor 14b and the back side connection surface 14y of the third interlayer connection conductor 14c are directly bonded and electrically connected with each other. The back side connection surface 14y of the certain interlayer connection conductor 14b and the back side connection surface 14y of the other interlayer connection conductor 14c are thus bonded to each other with a large bonding region, stabilizing the bonding between the second interlayer connection conductor 14b and the third interlayer connection conductor 14c. When the above-described connection structure is described in other words, the second interlayer connection conductor 14b and the third interlayer connection conductor 14c are electrically connected with each other without interposing the internal electrode 24 therebetween. This configuration can reduce or prevent generation of unwanted electrostatic capacitance with respect to other various electrodes (other internal electrodes 24, the front electrode 7, or the back electrode 9).

The back electrode 9 defining and functioning as the conductive layer 20 is preferably provided on the back surface of the multilayer body 2, that is, on the back surface of the third resin layer 10c. The terminal 5 of the electronic component 4 is bonded to the back electrode 9 with a conductive bonding material, not illustrated, interposed therebetween and the terminal 5 is electrically connected with the back electrode 9. Accordingly, the back electrode 9 on the back surface of the third resin layer 10c acts as a mounting electrode to mount the electronic component 4. The back electrode 9 on the back side preferably has, for example, a circular or substantially circular shape when viewed in the laminating direction Z. The electronic component 4 mounted on the back side is preferably, for example, an IC chip. Thus, the resin multilayer substrate 1 according to the fourth preferred embodiment can mount the electronic components 4 on both of the front side and the back side thereof.

When viewed in the laminating direction Z, the first internal electrode 24a preferably has, for example, the circular or substantially circular shape as described above and the back electrode 9 on the back side has a shape covering the front side connection surface 14x of the third interlayer connection conductor 14c such as the same as or similar shape to that of the front side connection surface 14x, more specifically, a circular or substantially circular shape, for example. The back electrode 9 on the back side has the same or substantially the same shape as that of the front electrode 7 on the front side. The first interlayer connection conductor 14a, the second interlayer connection conductor 14b, and the third interlayer connection conductor 14c are on positions overlapping with each other in a substantially straight line when viewed in the laminating direction Z and the region of the front electrode 7 on the front side and the region of the back electrode 9 on the back side are within the outer edge of the region of the first internal electrode 24a when viewed in the laminating direction Z. In addition to the electrode structure 3 in which the front electrode 7 is smaller than the first internal electrode 24a and is within the outer edge of the first internal electrode 24a when viewed in the laminating direction Z, the back electrode 9 is within the outer edge of the first internal electrode 24a when viewed in the laminating direction Z. Thus, the resin multilayer substrate 1 that can mount the electronic components 4 on the front side and back side thereof can reduce or prevent each of electrostatic capacitance generated between the front electrode 7 and the first internal electrode 24a and electrostatic capacitance generated between the back electrode 9 and the first internal electrode 24a.

Fifth Preferred Embodiment

Figure 8:
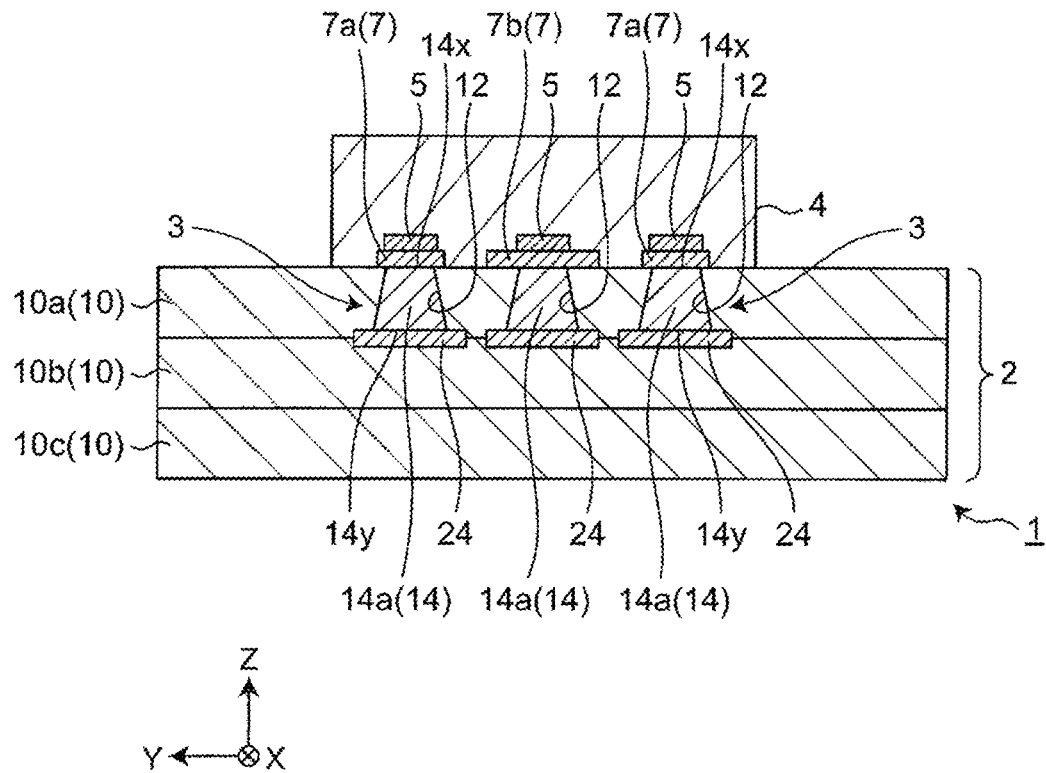
FIG. 8 is a sectional view schematically illustrating a resin multilayer substrate according to a fifth preferred embodiment of the present invention.

The resin multilayer substrate 1 according to a fifth preferred embodiment of the present invention will be described with reference to FIG. 8. FIG. 8 is a sectional view schematically illustrating the resin multilayer substrate 1 according to the fifth preferred embodiment. The fifth preferred embodiment is characterized in that a front electrode for ground 7b is preferably arranged between front electrodes for signal 7a and 7a that are adjacent to each other.

In FIG. 8, a plurality of front electrodes 7 are provided on the front side of the first resin layer 10a, the plurality of front electrodes 7 are configured as the front electrodes for signal 7a and the front electrodes for ground 7b, and the front electrode for ground 7b is arranged between the front electrodes for signal 7a and 7a that are adjacent to each other. This configuration can improve isolation and reduce or prevent cross talk between terminals 5 and 5 for signal that are adjacent to each other.

In terms of the front electrode for signal 7a, the electrode structure 3 is used, in which the front electrode 7 is smaller than the first internal electrode 24a and is within the outer edge of the first internal electrode 24a when viewed in the laminating direction Z. In terms of the front electrode for ground 7b, the front electrode for ground 7b may be configured to have the same or substantially the same shape as that of the first internal electrode 24a when viewed in the laminating direction Z. This configuration can increase bonding strength of the front electrode for ground 7b with respect to the front surface of the first resin layer 10a and increase connection strength between the electronic component 4 and the resin multilayer substrate 1. An area of the front electrode for ground 7b is larger than an area of the front electrode for signal 7a. This configuration can increase the bonding strength of the front electrode for ground 7b with respect to the front surface of the first resin layer 10a and increase the connection strength between the electronic component 4 and the resin multilayer substrate 1. Alternatively, for the front electrode for ground 7b, the electrode structure 3 may be used, in which the front electrode for ground 7b is within the outer edge of the first internal electrode 24a when viewed in the laminating direction Z. This configuration can reduce or prevent electrostatic capacitance generated between the front electrode for signal 7a and the front electrode for ground 7b.

Sixth Preferred Embodiment

Figure 9:
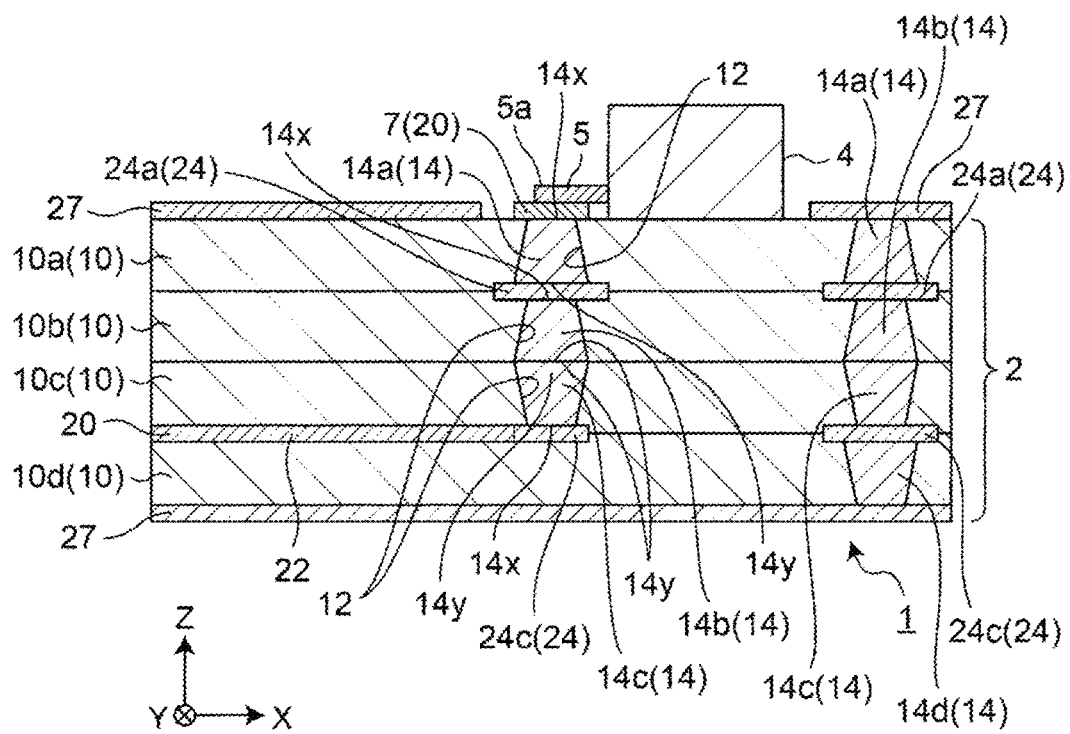
FIG. 9 is a sectional view schematically illustrating a resin multilayer substrate according to a sixth preferred embodiment of the present invention.

The resin multilayer substrate 1 according to a sixth preferred embodiment of the present invention will be described with reference to FIG. 9. FIG. 9 is a sectional view schematically illustrating the resin multilayer substrate 1 according to the sixth preferred embodiment. The sixth preferred embodiment is characterized in that the electrode structure 3, in which the front electrode 7 is smaller than the first internal electrode 24a and is within the outer edge of the first internal electrode 24a when viewed in the laminating direction Z, is provided on the front side of the multilayer body 2 and a ground electrode layer 27 is provided on the back side of the multilayer body 2.

Referring to FIG. 9, the resin multilayer substrate 1 preferably further includes a third internal electrode 24c, a fourth resin layer (fourth insulating layer) 10d, and the ground electrode layer 27, when compared to the fourth preferred embodiment illustrated in FIG. 7. The third internal electrode 24c is electrically connected with the third interlayer connection conductor 14c. The ground electrode layer 27 is provided on the back surface of the fourth resin layer 10d (the back surface of the multilayer body 2).

The third interlayer connection conductor 14c penetrates through the third resin layer 10c in the laminating direction Z and has, for example, a tapered shape that decreases in diameter from the inner side (front side) of the multilayer body 2 toward the back side. The third interlayer connection conductor 14c includes the front side connection surface 14x positioned closer to the back side and the back side connection surface 14y positioned on the opposite side to the front side connection surface 14x (the front side). The third internal electrode 24c is electrically connected with the front side connection surface 14x of the third interlayer connection conductor 14c.

When viewed in the laminating direction Z, the third internal electrode 24c has a shape covering the front side connection surface 14x of the third interlayer connection conductor 14c such as the same or similar shape to that of the front side connection surface 14x, more specifically, a circular or substantially circular shape, for example. The third internal electrode 24c preferably has the same or substantially the same shape as that of the front electrode 7 on the front side. The third internal electrode 24c is opposed to the ground electrode layer 27. The conductive layer 20 extending in the surface direction which is orthogonal or substantially orthogonal to the laminating direction Z is provided between the third resin layer 10c and the fourth resin layer 10d. The conductive layer 20 includes the third internal electrode 24c and the signal line 22 communicating with the third internal electrode 24c. Viewed in the laminating direction Z, the signal line 22 has, for example, a rectangular or substantially rectangular shape.

On the back surface of the fourth resin layer 10d (the back surface of the multilayer body 2), the ground electrode layer 27 is provided. The ground electrode layer 27 extends in the surface direction that is orthogonal or substantially orthogonal to the laminating direction Z of the multilayer body 2. The ground electrode layer 27 is preferably a metal foil such as, for example, a copper foil. The ground electrode layer 27 covers the back surface of the fourth resin layer 10d (the back surface of the multilayer body 2) and may include an opening as necessary.

The third internal electrode 24c covers the front side connection surface 14x of the third interlayer connection conductor 14c and corresponds to the front side connection surface 14x of the third interlayer connection conductor 14c to have a small diameter. Thus, the region of the third internal electrode 24c is small. This configuration can reduce or prevent electrostatic capacitance generated between the third internal electrode 24c and the ground electrode layer 27.

On the front surface of the first resin layer 10a (the front surface of the multilayer body 2) on which the front electrode 7 is provided, the ground electrode layer 27 can be provided. The ground electrode layer 27 extends in the surface direction which is orthogonal or substantially orthogonal to the laminating direction Z of the multilayer body 2. The ground electrode layer 27 on the front surface of the multilayer body 2 is preferably a metal foil such as, for example, a copper foil, covers the front surface of the first resin layer 10a, and includes an opening that is configured not to overlap with the internal electrode 24 when viewed in the laminating direction Z. This configuration can reduce or prevent electrostatic capacitance generated between the ground electrode layer 27, provided on the front surface of the multilayer body 2, and the internal electrode 24.

The resin multilayer substrate 1 may have a layered structure, in which a ground electrode layer, a plurality of interlayer connection conductors, a plurality of internal electrodes, and another ground electrode layer are laminated and are electrically connected with each other, adjacent to the electronic component 4 (on the right side in FIG. 9). This layered structure includes the ground electrode layer 27 on the front side, the first interlayer connection conductor 14a, the first internal electrode 24a, the second interlayer connection conductor 14b, the third interlayer connection conductor 14c, the third internal electrode 24c, a fourth interlayer connection conductor 14d, and the ground electrode layer 27 on the back side, in order from the front surface side. For example, the first interlayer connection conductor 14a and the second interlayer connection conductor 14b have a tapered shape that decreases in diameter from the back side of the multilayer body 2 toward the front side, and the third interlayer connection conductor 14c and the fourth interlayer connection conductor 14d have a tapered shape that decreases in diameter from the front side of the multilayer body 2 toward the back side. The ground electrode layer 27 on the front side, which is on the left side in FIG. 9, and the ground electrode layer 27 on the front side, which is on the right side in FIG. 9, may be electrically connected with each other. The configuration can be used in which the electronic component 4 is surrounded by the ground electrode layer 27 on the front side, provided on the left side, and the ground electrode layer 27 on the front side, provided on the right side.

Seventh Preferred Embodiment

Figure 10:
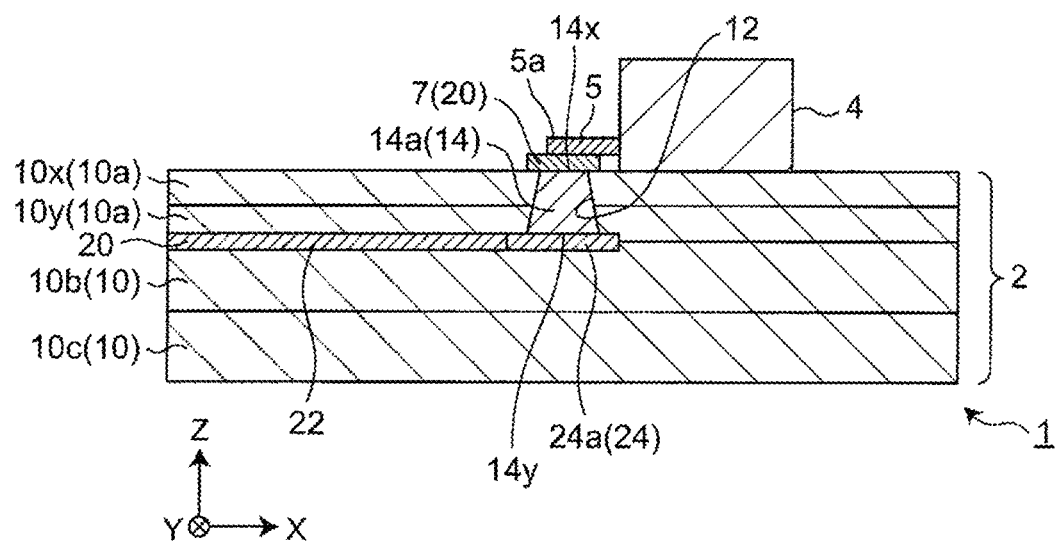
FIG. 10 is a sectional view schematically illustrating a resin multilayer substrate according to a seventh preferred embodiment of the present invention.

The resin multilayer substrate 1 according to a seventh preferred embodiment of the present invention will be described with reference to FIG. 10. FIG. 10 is a sectional view schematically illustrating the resin multilayer substrate 1 according to the seventh preferred embodiment. The seventh preferred embodiment is characterized in that the resin layer 10 preferably includes a multilayered structure including a certain sub resin layer 10x and another sub resin layer 10y.

Referring to FIG. 10, the first resin layer 10a includes a multilayered structure that includes the certain sub resin layer (certain sub insulating layer) 10x and another sub resin layer (another sub insulating layer) 10y. The certain sub resin layer 10x is positioned on the front side and the other sub resin layer 10y is positioned in the inner side (back side). The other sub resin layer 10y is, for example, resin having a lower relative dielectric constant than the certain sub resin layer 10x. The certain sub resin layer 10x is, for example, liquid crystal polymer resin (LCP resin). The other sub resin layer 10y is preferably, for example, thermoplastic fluororesin such as polytetrafluoroethylene resin (PTFE resin) and perfluoroalkoxy alkane resin (PFA resin).

The second resin layer 10b is preferably, for example, liquid crystal polymer resin (LCP resin). The third resin layer 10c is preferably, for example, liquid crystal polymer resin (LCP resin).

The resin layer 10 includes the other sub resin layer 10y having the low relative dielectric constant and accordingly, unwanted electrostatic capacitance can be reduced or prevented. In the arrangement illustrated in FIG. 10, the other sub resin layer 10y having the low relative dielectric constant is in contact with the signal line 22, accordingly being able to relax an electric field generated around the signal line 22 and increase the line width of the signal line 22. This can reduce or prevent an increase of conductor loss of the signal line 22 in the high frequency band. In addition to this, dielectric loss can be also reduced when a dielectric loss tangent of the other sub resin layer 10y is low.

An arrangement inverted from the arrangement illustrated in FIG. 10 can be used. That is, the other sub resin layer 10y having the low relative dielectric constant may be on the front side and the certain sub resin layer 10x having the higher relative dielectric constant than that of the other sub resin layer 10y may be on the inner side (back side). The other sub resin layer 10y having the low relative dielectric constant comes into contact with the front electrode 7 in this configuration, being able to reduce or prevent electrostatic capacitance generated between the front electrodes 7 and 7 that are adjacent to each other.

The seventh preferred embodiment uses the resin layer 10 having the multilayered structure including the certain sub resin layer 10x and the other sub resin layer 10y, as the first resin layer 10a that is positioned on the front side of the multilayer body 2. However, the resin layer 10 having the multilayered structure is arbitrarily used for various resin layers 10 such as the second resin layer 10b and the third resin layer 10c that are positioned in the inside of the multilayer body 2 and the fourth resin layer 10d that is positioned on the back side of the multilayer body 2. As the multilayered structure of the resin layer 10, a two layer structure including the certain sub resin layer 10x and the other sub resin layer 10y is illustrated. However, if desired, a three layer structure, a four layer structure, or the like may be used that includes the same sub resin layers as the certain sub resin layer 10x and the other sub resin layer 10y or further includes other sub resin layers that are different from the certain sub resin layer 10x and the other sub resin layer 10y.

Method for Manufacturing Resin Multilayer Substrate

An example preferred embodiment of a method for manufacturing the resin multilayer substrate 1 will be described with reference to FIGS. 11A-11E. FIGS. 11A-11E are drawings illustrating the method for manufacturing the resin multilayer substrate 1.

The resin multilayer substrate 1 described above is preferably manufactured using the manufacturing method described below, for example.

Figure 11A:
FIGS. 11A-11E are drawings illustrating a method for manufacturing a resin multilayer substrate according to a preferred embodiment of the present invention.

As illustrated in FIG. 11A, a plurality of resin layers 10 provided with the conductive layer 20 are prepared (a process of preparing a plurality of resin layers 10). The resin layer 10 provided with the conductive layer 20 is a sheet obtained by laminating a conductor foil acting as the conductive layer 20 on one side of the resin layer 10. The resin layer 10 is preferably made of thermoplastic resin and is, for example, liquid crystal polymer resin (LCP resin). The conductive layer 20 is a metal foil such as a copper foil, for example.

Figure 11B:
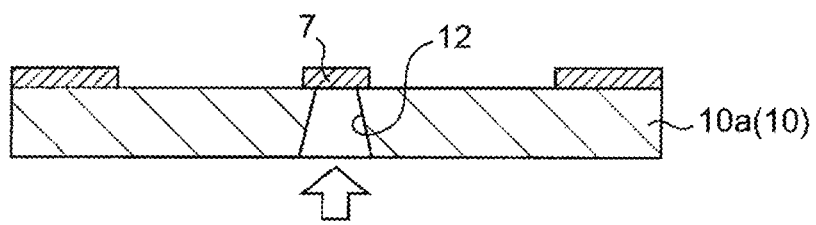

As illustrated in FIG. 11B, the resin layer 10 provided with the conductive layer 20 is irradiated with laser light from the resin layer 10 side so as to form the interlayer connection hole 12 penetrating through the resin layer 10 (a process of forming the interlayer connection hole 12). The interlayer connection hole 12 penetrates through the resin layer 10 but does not penetrate through the conductive layer 20. Since the interlayer connection hole 12 is formed by the irradiation of laser light, the interlayer connection hole 12 has a tapered shape that decreases in diameter from the resin layer 10 side toward the conductive layer 20 side. The interlayer connection hole 12 is formed on a position corresponding to the front electrode 7 and the first internal electrode 24a. The conductive layer 20 is preferably patterned by photolithography, for example, forming a desired conductor pattern on one surface of the resin layer 10. For example, on the first resin layer 10a to be positioned on the front side of the multilayer body 2, the front electrode 7 is formed as a conductive pattern (a process of forming the front electrode 7). On the second resin layer 10b to be positioned in the inner side (back side) of the multilayer body 2, the signal line 22 and the first internal electrode 24a are formed as the conductive pattern (a process of forming the first internal electrode 24a).

Figure 11C:
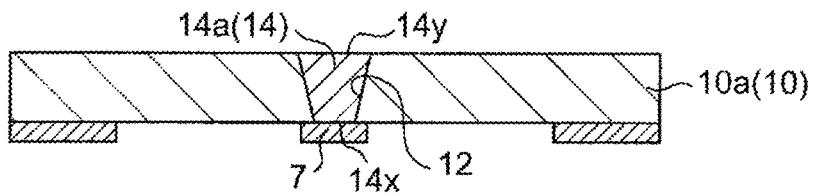

As illustrated in FIG. 11C, the interlayer connection hole 12 is filled with a conductive paste by, for example, screen printing or the like. Accordingly, the first interlayer connection conductor 14a having a tapered shape that decreases in diameter from the resin layer 10 side toward the conductive layer 20 side is formed (a process of forming the first interlayer connection conductor 14a).

The first interlayer connection conductor 14a having the tapered shape has the front side connection surface 14x and the back side connection surface 14y. The front side connection surface 14x is positioned on the conductive layer 20 side and is electrically connected with the front electrode 7. The back side connection surface 14y is positioned on the opposite side to the front side connection surface 14x. Each of the front side connection surface 14x and the back side connection surface 14y of the first interlayer connection conductor 14a has, for example, a circular or substantially circular shape when viewed in the laminating direction Z. The outer shape of the front side connection surface 14x of the first interlayer connection conductor 14a is within the outer shape of the back side connection surface 14y of the first interlayer connection conductor 14a. The position of the front side connection surface 14x of the first interlayer connection conductor 14a corresponds to the position of the front electrode 7. The front electrode 7 described above covers the front side connection surface 14x of the first interlayer connection conductor 14a and accordingly, the front electrode 7 has a smaller diameter than the first internal electrode 24a. The first internal electrode 24a described above covers the back side connection surface 14y of the first interlayer connection conductor 14a and accordingly, the first internal electrode 24a has a larger diameter than the front electrode 7. Here, a conductor pattern such as the front electrode 7 and the first internal electrode 24a may be formed after the first interlayer connection conductor 14a is first formed.

Figure 11D:
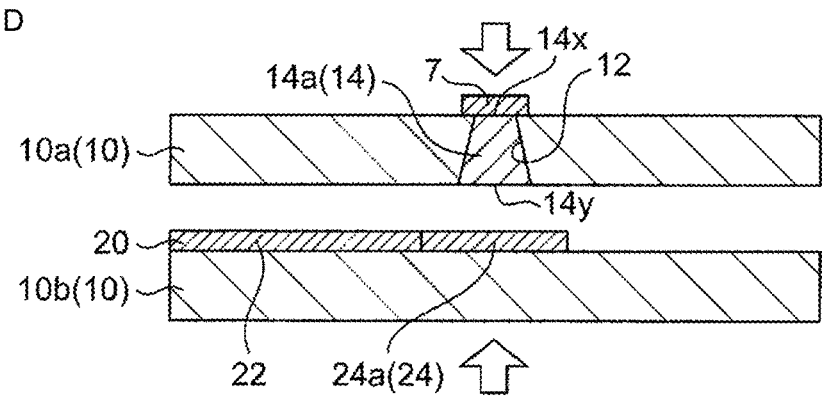

As illustrated in FIG. 11D, a plurality of resin layers 10, which include the first resin layer 10a provided with the front electrode 7 and the second resin layer 10b provided with the signal line 22 and the first internal electrode 24a, are stacked in the laminating direction Z (a process of stacking the resin layers 10). The first resin layer 10a and the second resin layer 10b are positioned so that the back side connection surface 14y of the first interlayer connection conductor 14a overlaps with the first internal electrode 24a when viewed in the laminating direction Z. The multilayer body 2 is preferably thermally press-bonded by, for example, applying heat and pressure in a state that the plurality of resin layers 10 are stacked (a process of thermally press-bonding the multilayer body 2). At this time, the conductive paste filled in the interlayer connection hole 12 solidifies, and the back side connection surface 14y of the first interlayer connection conductor 14a is bonded to the first internal electrode 24a and is electrically connected with the first internal electrode 24a.

Figure 11E:
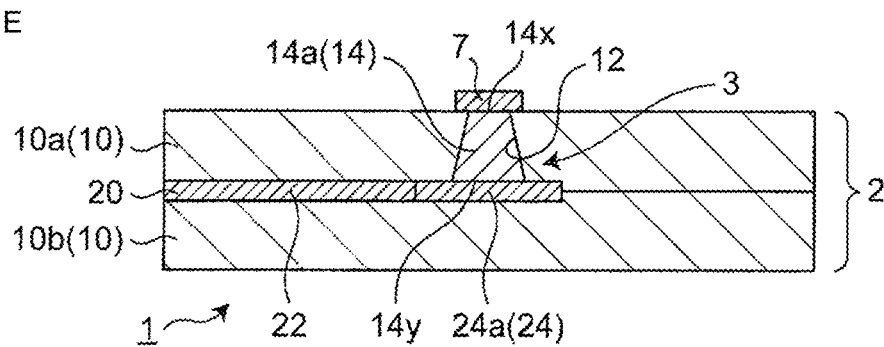

As illustrated in FIG. 11E, the multilayer body 2 that is thermally press-bonded includes the electrode structure 3 in which the front electrode 7 is smaller than the first internal electrode 24a and is within the outer edge of the first internal electrode 24a when viewed in the laminating direction Z. The protective layer 31 may be provided on the front surface of the first resin layer 10a as necessary. A conductive bonding material is applied to the front electrode 7, the electronic component 4 is placed on the front electrode 7, and a reflow processing is performed to surface-mount the electronic component 4 on the resin multilayer substrate 1.

According to the above-described manufacturing method, the electrode structure 3, in which the front electrode 7 is smaller than the first internal electrode 24a and is within the outer edge of the first internal electrode 24a when viewed in the laminating direction Z, is formed in the multilayer body 2. Accordingly, the region of the front electrode 7 covering the front side connection surface 14x of the first interlayer connection conductor 14a is smaller than the region of the first internal electrode 24a covering the back side connection surface 14y of the first interlayer connection conductor 14a, consequently being able to reduce or prevent electrostatic capacitance generated between the front electrode 7 and the first internal electrode 24a.

Although the specific preferred embodiments of the present invention have been described, the present invention is not limited to the above-described preferred embodiments and can be variously modified and performed within the scope of the present invention.

The interlayer connection conductor 14 such as the first interlayer connection conductor 14a, the second interlayer connection conductor 14b, and the third interlayer connection conductor 14c preferably has, for example, a trapezoidal-tapered shape in the cross-sectional view. However, the interlayer connection conductor 14 sometimes has a rectangular or substantially rectangular shape or has discontinuous sides, for example, in practical terms and therefore examples of the shape of the interlayer connection conductor 14 include these various shapes.

The shape of each of the front electrode 7, the internal electrode 24, the front side connection surface 14x, and the back side connection surface 14y may be an elliptical or substantially elliptical shape, an oval or substantially oval shape, or a rectangular or substantially rectangular shape as well as a circular or substantially rectangular shape.

The present invention and the preferred embodiments can be summarized as follows.

A multilayer substrate 1 according to a preferred embodiment of the present invention includes:
  a multilayer body 2 in which insulating layers 10 are laminated in a laminating direction Z;
  a front electrode 7 on a front side of a first insulating layer 10a which is positioned on a front side of the multilayer body 2 among the insulating layers 10;
  a first internal electrode 24a on a back side of the first insulating layer 10a; and
  a first interlayer connection conductor 14a penetrating through the first insulating layer 10a in the laminating direction Z and electrically connects the front electrode 7 and the first internal electrode 24a with each other, wherein
  the first interlayer connection conductor 14a includes a front side connection surface 14x, which is electrically connected with the front electrode 7, and a back side connection surface 14y, which is electrically connected with the first internal electrode 24a,
  an outer shape of the front side connection surface 14x of the first interlayer connection conductor 14a is within an outer shape of the back side connection surface 14y of the first interlayer connection conductor 14a,
  the front electrode 7 has a shape covering the front side connection surface 14x of the first interlayer connection conductor 14a and the first internal electrode 24a has a shape covering the back side connection surface 14y of the first interlayer connection conductor 14a, and
  the front electrode 7 includes an electrode structure in which the front electrode 7 is smaller than the first internal electrode 24a and is within an outer edge of the first internal electrode 24a when viewed in the laminating direction Z.

According to the above-described configuration, the region of the front electrode 7 covering the front side connection surface 14x of the first interlayer connection conductor 14a is smaller than the region of the first internal electrode 24a covering the back side connection surface 14y of the first interlayer connection conductor 14a and accordingly, electrostatic capacitance generated between the front electrode and the first internal electrode 24a can be reduced or prevented.

In a multilayer substrate 1 according to a preferred embodiment,
  the front side connection surface 14x of the first interlayer connection conductor 14a has a circular or substantially circular shape when viewed in the laminating direction Z,
  the back side connection surface 14y of the first interlayer connection conductor 14a has a circular or substantially circular shape when viewed in the laminating direction Z, and
  a diameter of the front side connection surface 14x is smaller than a diameter of the back side connection surface 14y.

According to the above-described preferred embodiment, generation of unwanted electrostatic capacitance can be reduced or prevented and positioning between the front side connection surface 14x and the front electrode 7 and positioning between the back side connection surface 14y and the first internal electrode 24a become easier.

In a multilayer substrate 1 according to another preferred embodiment, an area of the front side connection surface 14x is smaller than an area of the back side connection surface 14y in the first interlayer connection conductor 14a.

According to the above-described preferred embodiment, generation of unwanted electrostatic capacitance can be reduced or prevented and positioning between the front side connection surface 14x and the front electrode 7 and positioning between the back side connection surface 14y and the first internal electrode 24a become easier.

In a multilayer substrate 1 according to another preferred embodiment, the front electrode 7 is an electrode to electrically connect a terminal 5 of an electronic component 4, the first internal electrode 24a communicates with a signal line 22 extending in a surface direction that is orthogonal to the laminating direction Z, and the signal line 22 extends so as not to overlap with the terminal 5 when viewed in the laminating direction Z.

According to the above-described preferred embodiment, electrostatic capacitance generated between the terminal 5 of the electronic component 4 and the signal line 22 can be reduced or prevented.

In a multilayer substrate 1 according to another preferred embodiment, an end portion 5a of the terminal 5 is within an outer edge of the front electrode 7 when viewed in the laminating direction Z.

According to the above-described preferred embodiment, electrostatic capacitance generated between the terminal 5 of the electronic component 4 and the first internal electrode 24a can be reduced or prevented.

A multilayer substrate 1 according to another preferred embodiment further includes:

a second insulating layer 10b that is on the back side of the first insulating layer 10a adjacent to the first insulating layer 10a;

a second internal electrode 24b that is provided on a back side of the second insulating layer 10b; and a second interlayer connection conductor 14b that penetrates through the second insulating layer 10b in the laminating direction Z and electrically connects the first internal electrode 24a and the second internal electrode 24b with each other, in which the second interlayer connection conductor 14b includes a front side connection surface 14x, which is electrically connected with the first internal electrode 24a, and a back side connection surface 14y, which is electrically connected with the second internal electrode 24b, an outer shape of the front side connection surface 14x of the second interlayer connection conductor 14b is within an outer shape of the back side connection surface 14y of the second interlayer connection conductor 14b, the second internal electrode 24b has a shape covering the back side connection surface 14y of the second interlayer connection conductor 14b, and the front electrode 7 is smaller than the second internal electrode 24b and is within an outer edge of the second internal electrode 24b when viewed in the laminating direction Z.

According to the above-described preferred embodiment, the region of the front electrode 7 covering the front side connection surface 14x of the first interlayer connection conductor 14a is smaller than the region of the second internal electrode 24b covering the back side connection surface 14y of the second interlayer connection conductor 14b and accordingly, electrostatic capacitance generated between the front electrode and the second internal electrode 24b can be reduced or prevented.

A multilayer substrate 1 according to another preferred embodiment further includes:

a third insulating layer 10c that is on the back side of the second insulating layer 10b adjacent to the second insulating layer 10b;

a third interlayer connection conductor 14c that penetrates through the third insulating layer 10c in the laminating direction Z and is electrically connected with the second interlayer connection conductor 14b;

a third internal electrode 24c that is electrically connected with a back side connection surface 14y of the third interlayer connection conductor 14c; and a ground electrode layer 27 that is provided on a back side of the multilayer body 2, in which the third internal electrode 24c is opposed to the ground electrode layer 27, the third internal electrode 24c has a shape covering the back side connection surface 14y of the third interlayer connection conductor 14c, and the third internal electrode 24c is smaller than the first internal electrode 24a and is within the outer edge of the first internal electrode 24a when viewed in the laminating direction Z.

According to the above-described preferred embodiment, the region of the third internal electrode 24c is smaller and accordingly, electrostatic capacitance generated between the third internal electrode 24c and the ground electrode layer 27 can be reduced or prevented.

A multilayer substrate 1 according to another preferred embodiment includes:

a protective layer 31 that has an electrical insulation property, covers a front surface of the first insulating layer 10a, and includes an opening 32 exposing a portion of the front electrode 7.

According to the above-described preferred embodiment, the region of the front electrode 7 is reduced in size and accordingly, electrostatic capacitance generated between the front electrode 7 and the terminal 5 can be reduced or prevented.

In a multilayer substrate 1 according to another preferred embodiment, the protective layer 31 is not provided between ones of the front electrodes 7 and 7 that are adjacent to each other.

According to the above-described preferred embodiment, electrostatic capacitance generated between mutually-adjacent terminals 5 and 5 can be reduced or prevented.

A multilayer substrate 1 according to another preferred embodiment further includes:

a back electrode 9 that is provided on a back side of a back side insulating layer 10c that is positioned on the back side of the multilayer body 2; and a back side interlayer connection conductor 14c that penetrates through the back side insulating layer 10c in the laminating direction Z and includes a back side connection surface 14y electrically connected with the back electrode 9, in which the back electrode 9 has a shape covering the back side connection surface 14y of the back side interlayer connection conductor 14c, and the back electrode 9 is smaller than the first internal electrode 24a and is within the outer edge of the first internal electrode 24a when viewed in the laminating direction Z.

According to the above-described preferred embodiment, the multilayer substrate 1 that can mount the electronic components 4 on both of the front side and back side thereof can reduce or prevent each of electrostatic capacitance generated between the front electrode 7 and the first internal electrode 24a and electrostatic capacitance generated between the back electrode 9 and the first internal electrode 24a.

In a multilayer substrate 1 according to another preferred embodiment, when a certain interlayer connection conductor 14b that penetrates through a certain insulating layer 10b, which defines the multilayer body 2, in the laminating direction Z and of which the outer shape of the front side connection surface 14x positioned closer to the front side of the multilayer body 2 is within the outer shape of the back side connection surface 14y positioned closer to the back side of the multilayer body 2, and another interlayer connection conductor 14c that penetrates through another insulating layer 10c, which is adjacent to the certain insulating layer 10b, in the laminating direction Z and of which the outer shape of the front side connection surface 14x positioned closer to the back side of the multilayer body 2 is within the outer shape of the back side connection surface 14y positioned closer to the front side of the multilayer body 2 form a connection structure in which the certain interlayer connection conductor 14b and the other interlayer connection conductor 14c are bonded in series in the laminating direction Z, the back side connection surface 14y of the certain interlayer connection conductor 14b and the back side connection surface 14y of the other interlayer connection conductor 14c are bonded to each other.

According to the above-described preferred embodiment, the back side connection surface 14y of the certain interlayer connection conductor 14b and the front side connection surface 14x of the other interlayer connection conductor 14c are bonded to each other with a large bonding region, stabilizing the bonding between the certain interlayer connection conductor 14b and the other interlayer connection conductor 14c.

In a multilayer substrate 1 according to another preferred embodiment,
    a plurality of the front electrodes 7 are provided on the front side of the first insulating layer 10a, and
    the plurality of front electrodes 7 are configured as front electrodes for signal 7a and a front electrode for ground 7b and the front electrode for ground 7b is arranged between ones of the front electrodes for signal 7a and 7a that are adjacent to each other.

According to the above-described preferred embodiment, isolation is improved and cross talk can be reduced or prevented between ones of the terminals 5 and 5 for signal that are adjacent to each other.

In a multilayer substrate 1 according to another preferred embodiment,
    an area of the front electrode for ground 7b is larger than an area of the front electrode for signal 7a.

According to the above-described preferred embodiment, connection strength between the electronic component 4 and the multilayer substrate 1 can be increased.

In a multilayer substrate 1 according to another preferred embodiment,
    the insulating layer 10 includes a multilayered structure that includes a certain sub insulating layer 10x and another sub insulating layer 10y having a lower relative dielectric constant than the certain sub insulating layer 10x.

According to the above-described preferred embodiment, the insulating layer 10 includes the other sub insulating layer 10y having a low relative dielectric constant, being able to reduce unwanted electrostatic capacitance.

In a multilayer substrate 1 according to another preferred embodiment,
    the other sub insulating layer 10y having the lower relative dielectric constant than the certain sub insulating layer 10x is arranged closer to the front electrode 7.

According to the above-described preferred embodiment, the other sub insulating layer 10y having the low relative dielectric constant comes into contact with the front electrode 7, being able to reduce or prevent electrostatic capacitance generated between the front electrodes 7 and 7 that are adjacent to each other.

In a multilayer substrate 1 according to another preferred embodiment,
    the other sub insulating layer 10y having the lower relative dielectric constant than the certain sub insulating layer 10x is arranged closer to the first internal electrode 24a.

According to the above-described preferred embodiment, the other sub insulating layer 10y is in contact with the signal line 22 and accordingly, an electric field generated around the signal line 22 can be relaxed and the line width of the signal line 22 can be increased, being able to reduce or prevent an increase of conductor loss of the signal line 22 in the high frequency band.

In a multilayer substrate 1 according to another preferred embodiment,
    the insulating layer 10 includes a multilayered structure that includes a certain sub insulating layer 10x and another sub insulating layer 10y having a lower dielectric loss tangent than the certain sub insulating layer 10x, and the other sub insulating layer 10y having the lower dielectric loss tangent than the certain sub insulating layer 10x is arranged closer to the first internal electrode 24a.

According to the above-described preferred embodiment, dielectric loss can be also reduced.

In a multilayer substrate 1 according to another preferred embodiment,
    the insulating layer 10 including the multilayered structure is used as the first insulating layer 10a.

According to the above-described preferred embodiment, an increase of the conductor loss of the signal line 22 in the high frequency band can be reduced or prevented and electrostatic capacitance generated between mutually-adjacent front electrodes 7 and 7 can be reduced or prevented.

A method for manufacturing a multilayer substrate 1 according to a preferred embodiment of the present invention includes:
    a process of preparing a plurality of insulating layers 10 including a first insulating layer 10a that is provided with a conductive layer 20, and a second insulating layer 10b that is provided with a conductive layer 20 and is on a back side of the first insulating layer 10a in a manner to be adjacent to the first insulating layer 10a;
    a process of forming an interlayer connection hole 12 in the first insulating layer 10a;
    a process of forming a first interlayer connection conductor 14a by filling the interlayer connection hole 12 with a conductive paste;

a process of forming a front electrode 7 on a position corresponding to the first interlayer connection conductor 14*a* by patterning the conductive layer 20 of the first insulating layer 10*a*;

a process of forming a first internal electrode 24*a* by patterning the conductive layer 20 of the second insulating layer 10*b*;

a process of stacking the first insulating layer 10*a* and the second insulating layer 10*b* in a laminating direction Z so that the first internal electrode 24*a* is on a position overlapping with the first interlayer connection conductor 14*a*; and a process of thermally press-bonding the first insulating layer 10*a* and the second insulating layer 10*b* that are stacked, in which the first interlayer connection conductor 14*a* includes a front side connection surface 14*x*, which is electrically connected with the front electrode 7, and a back side connection surface 14*y*, which is electrically connected with the first internal electrode 24*a*, an outer shape of the front side connection surface 14*x* of the first interlayer connection conductor 14*a* is within an outer shape of the back side connection surface 14*y* of the first interlayer connection conductor 14*a*, the front electrode 7 has a shape covering the front side connection surface 14*x* of the first interlayer connection conductor 14*a* and the first internal electrode 24*a* has a shape covering the back side connection surface 14*y* of the first interlayer connection conductor 14*a*, and an electrode structure 3 in which the front electrode 7 is smaller than the first internal electrode 24*a* and is within an outer edge of the first internal electrode 24*a* when viewed in the laminating direction Z is formed.

According to the above-described manufacturing method, the electrode structure 3, in which the front electrode 7 is within the outer edge of the first internal electrode 24*a* when viewed in the laminating direction Z, is formed in the multilayer body 2. Accordingly, the region of the front electrode 7 covering the front side connection surface 14*x* of the first interlayer connection conductor 14*a* is smaller than the region of the first internal electrode 24*a* covering the back side connection surface 14*y* of the first interlayer connection conductor 14*a*, consequently being able to reduce or prevent electrostatic capacitance generated between the front electrode 7 and the first internal electrode 24*a*.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
a multilayer body including insulating layers laminated in a laminating direction;
a front electrode on a front side of a first insulating layer, the first insulating layer being positioned on a front side of the multilayer body among the insulating layers;
a first internal electrode on a back side of the first insulating layer; and
a first interlayer connection conductor penetrating through the first insulating layer in the laminating direction and electrically connecting the front electrode and the first internal electrode with each other; wherein
the first interlayer connection conductor includes a front side connection surface, the front side connection surface being electrically connected with the front electrode, and a back side connection surface, the back side connection surface being electrically connected with the first internal electrode;

an outer shape of the front side connection surface of the first interlayer connection conductor is within an outer shape of the back side connection surface of the first interlayer connection conductor;

the front electrode has a shape covering the front side connection surface of the first interlayer connection conductor and the first internal electrode has a shape covering the back side connection surface of the first interlayer connection conductor; and the front electrode is smaller than the first internal electrode and is within an outer edge of the first internal electrode when viewed in the laminating direction, wherein the front side connection surface of the first interlayer connection conductor has a circular or substantially circular shape when viewed in the laminating direction;

the back side connection surface of the first interlayer connection conductor has a circular or substantially circular shape when viewed in the laminating direction; and a diameter of the front side connection surface is smaller than a diameter of the back side connection surface.

2. The multilayer substrate according to claim 1, wherein an area of the front side connection surface is smaller than an area of the back side connection surface in the first interlayer connection conductor.

3. The multilayer substrate according to claim 1, wherein the front electrode is to electrically connect a terminal of an electronic component;

the first internal electrode communicates with a signal line extending in a surface direction that is orthogonal to the laminating direction; and the signal line extends so as not to overlap with the terminal when viewed in the laminating direction.

4. The multilayer substrate according to claim 3, wherein an end portion of the terminal is within an outer edge of the front electrode when viewed in the laminating direction.

5. The multilayer substrate according to claim 1, further comprising:
a second insulating layer on the back side of the first insulating layer adjacent to the first insulating layer;
a second internal electrode on a back side of the second insulating layer; and
a second interlayer connection conductor penetrating through the second insulating layer in the laminating direction and electrically connecting the first internal electrode and the second internal electrode with each other; wherein
the second interlayer connection conductor includes a front side connection surface, the front side connection surface being electrically connected with the first internal electrode, and a back side connection surface, the back side connection surface being electrically connected with the second internal electrode;

an outer shape of the front side connection surface of the second interlayer connection conductor is within an outer shape of the back side connection surface of the second interlayer connection conductor;

the second internal electrode has a shape covering the back side connection surface of the second interlayer connection conductor; and the front electrode is smaller than the second internal electrode and is within an outer edge of the second internal electrode when viewed in the laminating direction.

6. The multilayer substrate according to claim 5, further comprising:
a third insulating layer on the back side of the second insulating layer adjacent to the second insulating layer;
a third interlayer connection conductor penetrating through the third insulating layer in the laminating direction and electrically connected with the second interlayer connection conductor;
a third internal electrode electrically connected with a back side connection surface of the third interlayer connection conductor; and
a ground electrode layer on a back side of the multilayer body; wherein
the third internal electrode is opposed to the ground electrode layer;
the third internal electrode has a shape covering the back side connection surface of the third interlayer connection conductor; and
the third internal electrode is smaller than the first internal electrode and is within the outer edge of the first internal electrode when viewed in the laminating direction.

7. The multilayer substrate according to claim 1, further comprising:
a protective layer that has an electrically insulation property, covers a front surface of the first insulating layer, and includes an opening exposing a portion of the front electrode.

8. The multilayer substrate according to claim 7, wherein a plurality of the front electrodes are provided; and
the protective layer is not provided between ones of the plurality of front electrodes that are adjacent to each other.

9. The multilayer substrate according to claim 1, further comprising:
a back electrode that on a back side of a back side insulating layer that is positioned on the back side of the multilayer body; and
a back side interlayer connection conductor penetrating through the back side insulating layer in the laminating direction and includes a back side connection surface electrically connected with the back electrode; wherein
the back electrode has a shape covering the back side connection surface of the back side interlayer connection conductor; and
the back electrode is smaller than the first internal electrode and is within the outer edge of the first internal electrode when viewed in the laminating direction.

10. The multilayer substrate according to claim 1, wherein when a certain interlayer connection conductor penetrating through a certain insulating layer, the certain insulating layer defining the multilayer body, in the laminating direction and of which an outer shape of a front side connection surface positioned closer to the front side of the multilayer body is within an outer shape of a back side connection surface positioned closer to the back side of the multilayer body, and another interlayer connection conductor that penetrates through another insulating layer, being adjacent to the certain insulating layer, in the laminating direction and of which an outer shape of a front side connection surface positioned closer to the back side of the multilayer body is within an outer shape of a back side connection surface positioned closer to the front side of the multilayer body form a connection structure in which the certain interlayer connection conductor and the other interlayer connection conductor are bonded in series in the laminating direction, the back side connection surface of the certain interlayer connection conductor and the back side connection surface of the other interlayer connection conductor are bonded to each other.

11. The multilayer substrate according to claim 1, wherein a plurality of the front electrodes are provided on the front side of the first insulating layer; and
the plurality of front electrodes are configured as a front electrode for signal and a front electrode for ground, a plurality of the front electrodes for signal are provided, and
the front electrode for ground is arranged between ones of the front electrodes for signal that are adjacent to each other.

12. The multilayer substrate according to claim 11, wherein
an area of the front electrode for ground is larger than an area of the plurality of the front electrodes for signal.

13. The multilayer substrate according to claim 1, wherein the insulating layer includes a multilayered structure that includes a certain sub insulating layer and another sub insulating layer having a lower relative dielectric constant than the certain sub insulating layer.

14. The multilayer substrate according to claim 13, wherein
the other sub insulating layer having the lower relative dielectric constant than the certain sub insulating layer is arranged closer to the front electrode.

15. The multilayer substrate according to claim 13, wherein
the other sub insulating layer having the lower relative dielectric constant than the certain sub insulating layer is arranged closer to the first internal electrode.

16. The multilayer substrate according to claim 1, wherein the insulating layer includes a multilayered structure that includes a certain sub insulating layer and another sub insulating layer having a lower dielectric loss tangent than the certain sub insulating layer, and the other sub insulating layer having the lower dielectric loss tangent than the certain sub insulating layer is arranged closer to the first internal electrode.

17. The multilayer substrate according to claim 13, wherein
the insulating layer having the multilayered structure is the first insulating layer.

18. A method for manufacturing a multilayer substrate, the method comprising:
a process of preparing insulating layers including a first insulating layer, the first insulating layer being provided with a conductive layer, and a second insulating layer, the second insulating layer being provided with a conductive layer and being arranged on a back side of the first insulating layer in a manner to be adjacent to the first insulating layer;
a process of forming an interlayer connection hole in the first insulating layer;
a process of forming a first interlayer connection conductor by filling the interlayer connection hole with a conductive paste;
a process of forming a front electrode on a position corresponding to the first interlayer connection conductor by patterning the conductive layer of the first insulating layer;

a process of forming a first internal electrode by patterning the conductive layer of the second insulating layer;

a process of stacking the first insulating layer and the second insulating layer in a laminating direction so that the first internal electrode is on a position overlapping with the first interlayer connection conductor; and a process of thermally press-bonding the first insulating layer and the second insulating layer that are stacked, wherein the first interlayer connection conductor includes a front side connection surface, the front side connection surface being electrically connected with the front electrode, and a back side connection surface, the back side connection surface being electrically connected with the first internal electrode;

an outer shape of the front side connection surface of the first interlayer connection conductor is within an outer shape of the back side connection surface of the first interlayer connection conductor;

the front electrode has a shape covering the front side connection surface of the first interlayer connection conductor and the first internal electrode has a shape covering the back side connection surface of the first interlayer connection conductor; and an electrode structure in which the front electrode is smaller than the first internal electrode and is within an outer edge of the first internal electrode when viewed in the laminating direction is formed, wherein the front side connection surface of the first interlayer connection conductor has a circular or substantially circular shape when viewed in the laminating direction;

the back side connection surface of the first interlayer connection conductor has a circular or substantially circular shape when viewed in the laminating direction; and a diameter of the front side connection surface is smaller than a diameter of the back side connection surface.

* * * * *